United States Patent
Kuo et al.

(10) Patent No.: US 7,613,005 B2
(45) Date of Patent: Nov. 3, 2009

(54) MOUNTING DEVICE FOR MOUNTING HEAT SINK ONTO ELECTRONIC COMPONENT

(75) Inventors: Jer-Haur Kuo, Taipei Hsien (TW); Xin-Xiang Zha, Shenzhen (CN); Ye-Fei Yu, Shenzhen (CN); Jun Li, Shenzhen (CN); Jun Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 26 days.

(21) Appl. No.: 12/110,341

(22) Filed: Apr. 27, 2008

(65) Prior Publication Data

US 2009/0244863 A1    Oct. 1, 2009

(30) Foreign Application Priority Data

Mar. 28, 2008   (CN) .................... 2008 1 0066344

(51) Int. Cl.
*H05K 7/20*   (2006.01)
(52) U.S. Cl. .............. 361/719; 361/704; 257/718; 257/719; 174/16.3; 165/80.3; 165/185
(58) Field of Classification Search .............. None
See application file for complete search history.

(56) References Cited

U.S. PATENT DOCUMENTS

| | | | |
|---|---|---|---|
| 5,677,829 A * | 10/1997 | Clemens | 361/697 |
| 6,728,103 B1 * | 4/2004 | Smedberg | 361/703 |
| 6,778,397 B2 * | 8/2004 | Segala | 361/719 |
| 6,882,534 B2 * | 4/2005 | Wang et al. | 361/704 |
| 6,947,284 B2 * | 9/2005 | Liu | 361/704 |
| 7,440,284 B1 * | 10/2008 | Lin | 361/719 |
| 7,480,144 B2 * | 1/2009 | Li | 361/704 |

* cited by examiner

*Primary Examiner*—Boris L Chervinsky
(74) *Attorney, Agent, or Firm*—Frank R. Niranjan

(57) ABSTRACT

A mounting device (10) for mounting a heat sink (40) onto a printed circuit board (60) with a heat generating electronic component (50) mounted thereon. The mounting device includes a mounting frame (101) and two resilient clips (102) attached to the mounting frame. The mounting frame includes two first mounting arms (1011) and two second mounting arms (1012) disposed above the first mounting arms. The first mounting arms are configured for being attached to the printed circuit board. The resilient clips are configured for being sandwiched between the second mounting arms of the mounting frame and the heat sink. The resilient clips each include two resilient arms (1023) configured for providing a resilient force which urges the heat sink toward the heat generating electronic component.

15 Claims, 6 Drawing Sheets

MOUNTING DEVICE FOR MOUNTING HEAT SINK ONTO ELECTRONIC COMPONENT

BACKGROUND

1. Technical Field

The present invention generally relates to mounting devices, and particularly to a mounting device for mounting a heat sink onto a heat generating electronic component.

2. Description of Related Art

It is well known that heat is generated during operations of a variety of electronic components, such as integrated circuit chips. To ensure normal and safe operations, cooling devices such as heat sinks are often employed to dissipate the generated heat away from these electronic components, and mounting devices are often employed to mount the cooling devices onto these electronic components.

A conventional way to secure the cooling device onto the electronic component is to screw a base of the heat sink onto a printed circuit board on which the electronic component is mounted. However, a magnitude of a force exerted on the electronic component is hard to be controlled. If the force is greater than a predetermined value, the electronic component will be damaged. If the force is smaller than the predetermined value, an intimate contact between the heat sink and the electronic component will not be kept.

What is needed, therefore, is a mounting device which can exert a predetermined force on the electronic component.

SUMMARY

The present invention relates to a mounting device for mounting a heat sink to a printed circuit board on which a heat generating electronic component is disposed. According to an embodiment of the present invention, the mounting device includes a mounting frame and two resilient clips attached to the mounting frame. The mounting frame includes two first mounting arms and two second mounting arms disposed above the first mounting arms. The first mounting arms are configured for being attached to the printed circuit board. The resilient clips are configured for being sandwiched between the second mounting arms of the mounting frame and the heat sink. The resilient clips each include two resilient arms configured for providing a resilient force which urges the heat sink toward the heat generating electronic component. Each resilient arm includes, in sequence from top to bottom, a first bending portion, a first slantwise extension portion, a second bending portion and a second slantwise extension portion. A third bending portion is curved upwardly and outwardly from a free end of the second slantwise extension portion. Each clip has a fastening plate attached to a corresponding second mounting arm, in which the first bending portion extends from an end of a lateral side of the fastening plate. The second slantwise extension portion engages with the heat sink.

Other advantages and novel features of the present invention will become more apparent from the following detailed description of embodiments when taken in conjunction with the accompanying drawings.

DETAILED DESCRIPTION OF THE EMBODIMENTS

Figure 1:
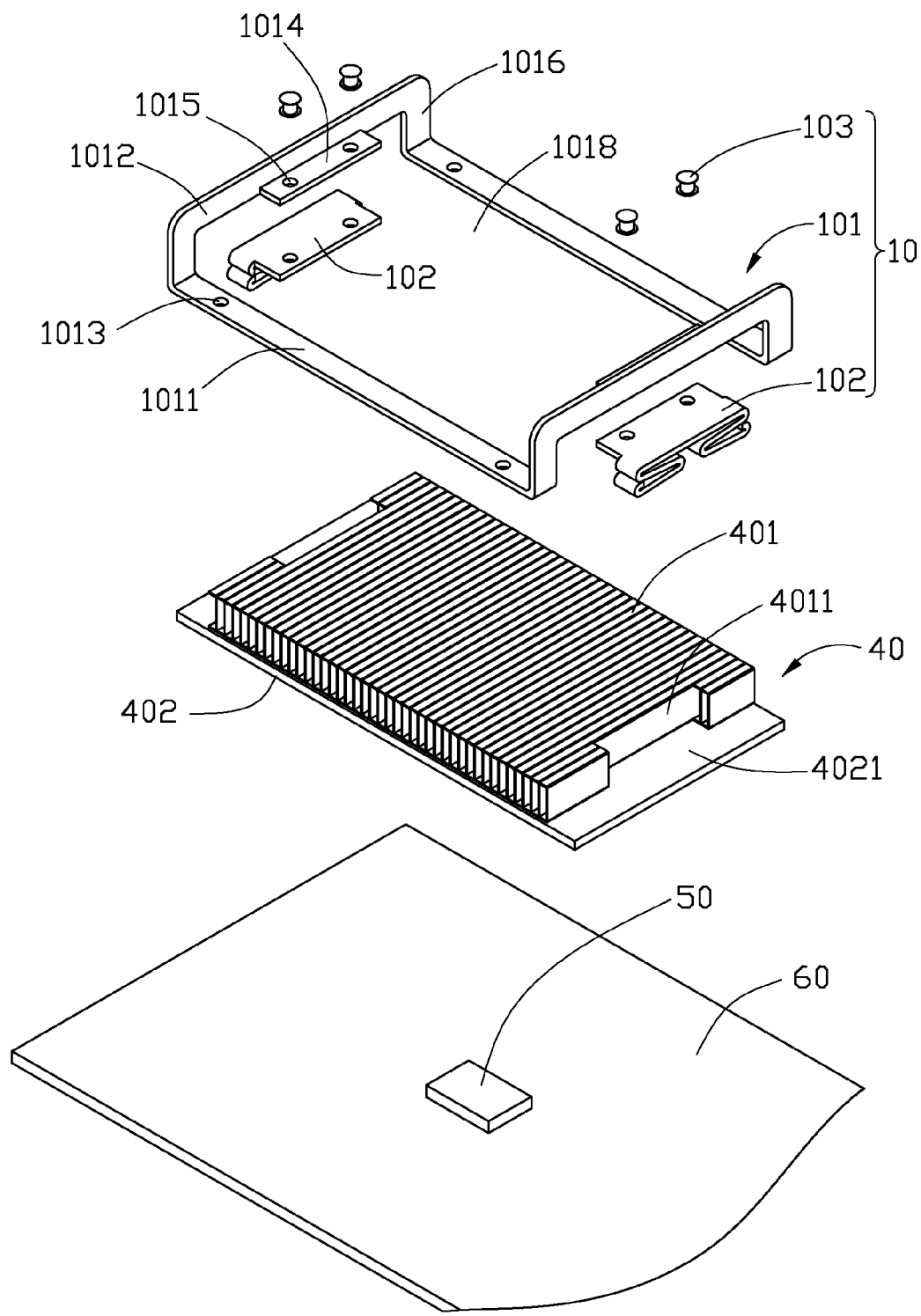
FIG. 1 an exploded, isometric view of an electronic apparatus incorporating a mounting device in accordance with a first embodiment of the present invention.

Reference will now be made to the drawing figures to describe the various present embodiments in detail.

Figure 2:
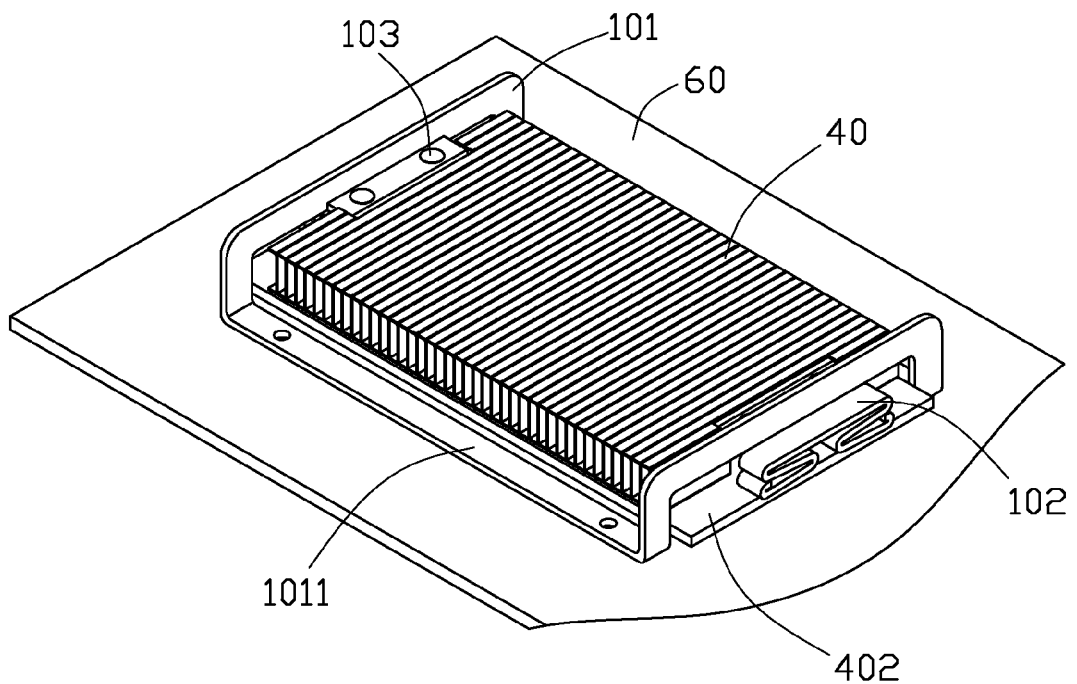
FIG. 2 is an assembled view of the electronic apparatus of FIG. 1.

Referring to FIGS. 1 and 2, an electronic apparatus in accordance with an embodiment of the present invention is shown. The electronic apparatus includes a printed circuit board 60, a heat generating electronic component 50, a heat sink 40 and a mounting device 10.

The heat generating electronic component 50 is disposed on the printed circuit board 60. The heat sink 40 is positioned on the heat generating electronic component 50 for dissipating heat generated by the heat generating electronic component 50. The mounting device 10 is used for mounting the heat sink 40 onto the heat generating electronic component 50.

The mounting device 10 includes a mounting frame 101, two resilient clips 102 attached to the mounting frame 101 and four rivets 103 for attaching the resilient clips 102 to the mounting frame 101.

The mounting frame 101 is substantially rectangular shaped as viewed from a top thereof and is formed from continuously punching a metal plate. An inner space 1018 is defined at a middle portion of the mounting frame 101, for receiving the heat sink 40 therein. The inner space 1018 is enclosed by a pair of first mounting arms 1011, a pair of second mounting arms 1012 and two pairs of connecting arms 1016 of the mounting frame 101. The first mounting arms 1011 are disposed at two opposite longer sides of the mounting frame 101 and the second mounting arms 1012 are disposed at two opposite shorter sides of the mounting frame 101 which are perpendicular to the longer sides. The first mounting arms 1011 are parallel to and space a distance from each other. The connecting arms 1016 extend vertically and upwardly from opposite ends of the first mounting arms 1011. Each of the second mounting arms 1012 connects integrally with top ends of adjacent connecting arms 1016 and spans across the first mounting arms 1011. The first mounting arms 1011 space a distance from the second mounting arms 1012 along a height direction of the mounting frame 101. In other words, the second mounting arms 1012 are located at a higher horizontal level than the first mounting arms 1011.

A flange 1014 extends from each of the second mounting arms 1012 of the mounting frame 101 toward the inner space 1018 of the mounting frame 101. The flange 1014 defines two mounting holes 1015 at opposite ends thereof, corresponding to two mounting holes 10211 (FIG. 3) defined in each of the resilient clips 102. The rivets 103 extend through the mounting holes 1015 of the flanges 1014 and the mounting holes 10211 of the resilient clips 102, thereby mounting the resilient clips 102 to the mounting frame 101.

Figure 3:
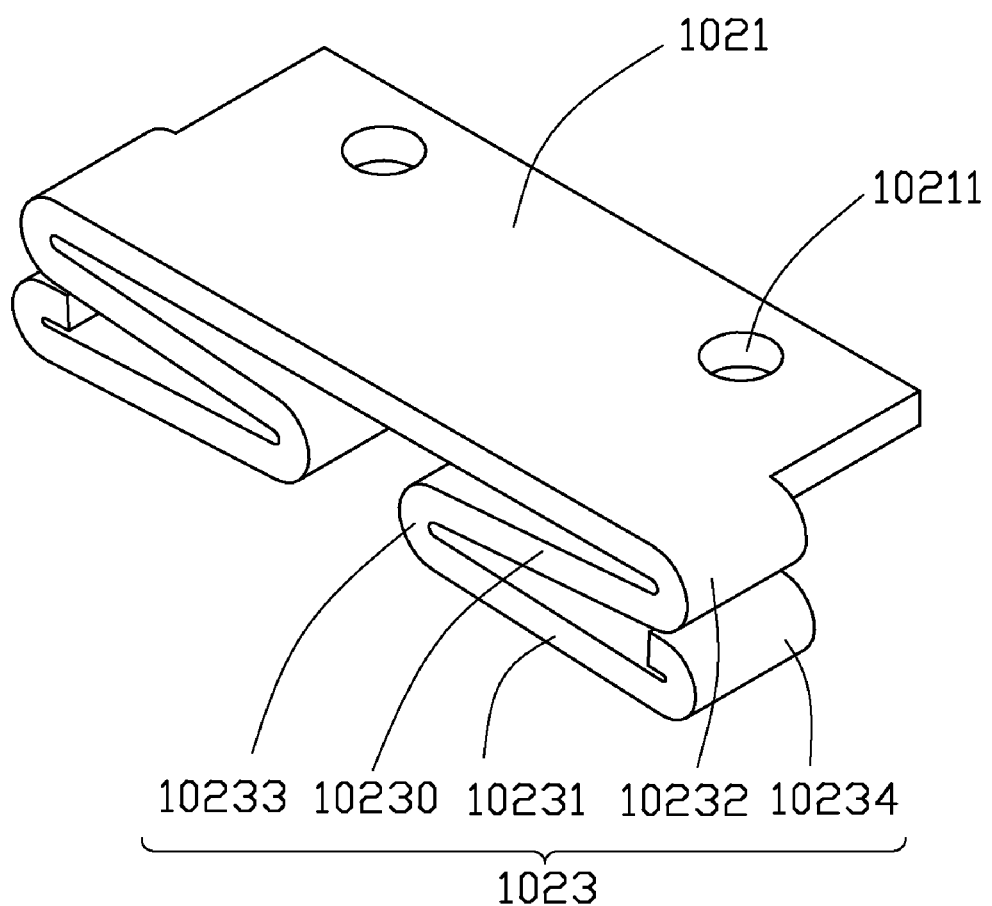
FIG. 3 is an isometric view of a resilient clip of the mounting device of FIG. 1.
Figure 4:
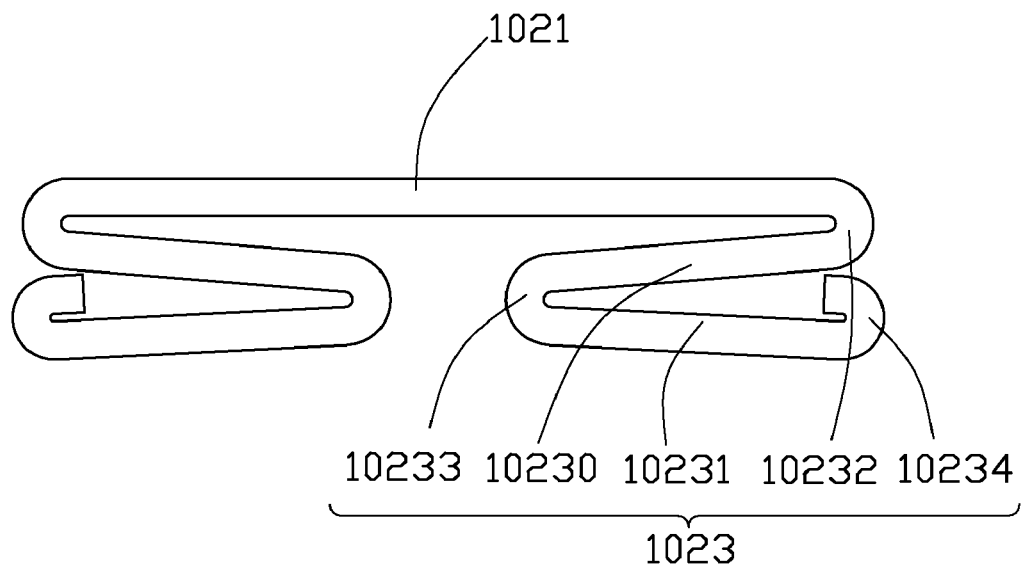
FIG. 4 is a front elevational view of the resilient clip of FIG. 3.

Referring to FIGS. 3 and 4, the resilient clip 102 includes a fastening plate 1021 and two resilient arms 1023 integrally disposed below the fastening plate 1021. The mounting holes 10211 of the resilient clip 102 are defined at opposite ends of an inner lateral side of the fastening plate 1021. The resilient arms 1023 extend downwardly from opposite ends of an outer lateral side of the fastening plate 1021. Each of the resilient arms 1023 is substantially V-shaped in profile and includes, in sequence along a top-to-bottom direction, a first bending portion 10232, a first slantwise extension portion 10230, a second bending portion 10233 and a second slantwise extension portion 10231. Finally, a third bending portion 10234 is curved upwardly from a free end of the second slantwise extension portion 10231.

The first bending portion 10232, the second bending portion 10233 and the third bending portion 10234 are substantially C-shaped. The first bending portion 10232 integrally connects the fastening plate 1021 with the first slantwise extension portion 10230. The first bending portion 10232 extends outwardly and downwardly from the fastening plate 1021 at first, and then inwardly and downwardly toward a middle portion of the fastening plate 1021. The first slantwise extension portion 10230 extends slantingly and downwardly from a free end of the first bending portion 10232 toward the middle portion of the fastening plate 1021. The second bending portion 10233 integrally connects a free end of the first slantwise extension portion 10230 with the second slantwise extension portion 10231. The second bending portion 10233 extends inwardly and downwardly from the free end of the first slantwise extension portion 10230 at first, and then outwardly and downwardly toward a corresponding one of the opposite ends of the fastening plate 1021. The second slantwise extension portion 10231 extends slantingly and downwardly from a free end of the second bending portion 10233 toward the corresponding one of the opposite ends of the fastening plate 1021. The third bending portion 10234 is integrally formed with the second slantwise extension portion 10231. The third bending portion 10234 extends upwardly from a free end of the second slantwise extension portion 10231 toward the corresponding one of the opposite ends of the fastening plate 1021 at first, and then inwardly toward the middle portion of the fastening plate 1021.

Referring back to FIG. 1, the heat sink 40 includes a base 402 and a fin assembly 401 arranged on the base 402. The fin assembly 401 defines two rectangular cutouts 4011 at lateral ends thereof, for receiving the resilient clips 102 therein. Lateral ends of the base 402 space a distance from corresponding lateral ends of the fin assembly 401. Two T-shaped supporting surfaces 4021 are therefore formed at the lateral ends of the base 402.

In assembly of the electronic apparatus, the heat sink 40 is placed on the heat generating electronic component 50. The mounting device 10 is placed around the heat sink 40, with the resilient arms 1023 of the resilient clips 102 received in the cutouts 4011 of the fin assembly 401 and the second slantwise extension portions 10231 of the resilient arms 1023 contacting with the supporting surfaces 4021 of the heat sink 40. In this position, the first mounting arms 1011 of the mounting frame 101 space a distance from the printed circuit board 60. Four fastening elements (not shown), such as screws or rivets, extend through mounting holes 1013 defined at the first mounting arms 1011 of the mounting frame 101 and through holes (not shown) defined in the printed circuit board 60, and are fixed to the printed circuit board 60. When the fastening elements are fixed to the printed circuit board 60, the distance between the first mounting arms 1011 of the mounting frame 101 and the printed circuit board 60 is decreased. Meanwhile, the resilient arm 1023 is deformed and a height of the resilient arm 1023 is decreased and a resilient force is accordingly generated by the resilient arm 1023. The resilient force urges the base 402 of the heat sink 40 downwardly toward the printed circuit board 60, thereby mounting the heat sink 40 onto the heat generating electronic component 50.

In the present electronic apparatus, the heat sink 40 is urged toward the heat generating electronic component 50 by the resilient force generated by the resilient arms 1023 of the resilient clips 102. The amount of the resilient force can be controlled by controlling the degree of the deformation of the resilient arms 1023 of the resilient clips 102. Moreover, the curved configurations of the third bending portions 10234 of the resilient clips 102 prevent an operator from being hurt by the sharp free ends of the second slantwise extension portions 10231.

Figure 5:
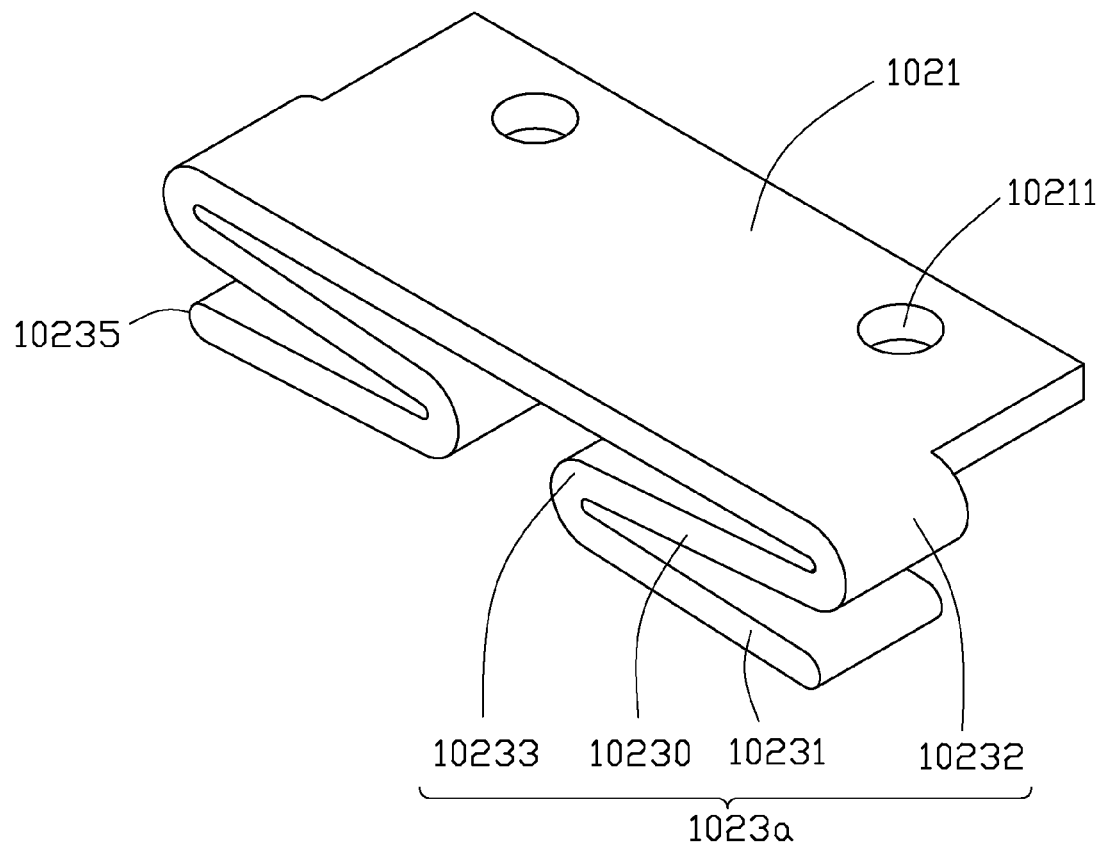
FIG. 5 is an isometric view of the resilient clip in accordance with a second embodiment of the present invention.
Figure 6:
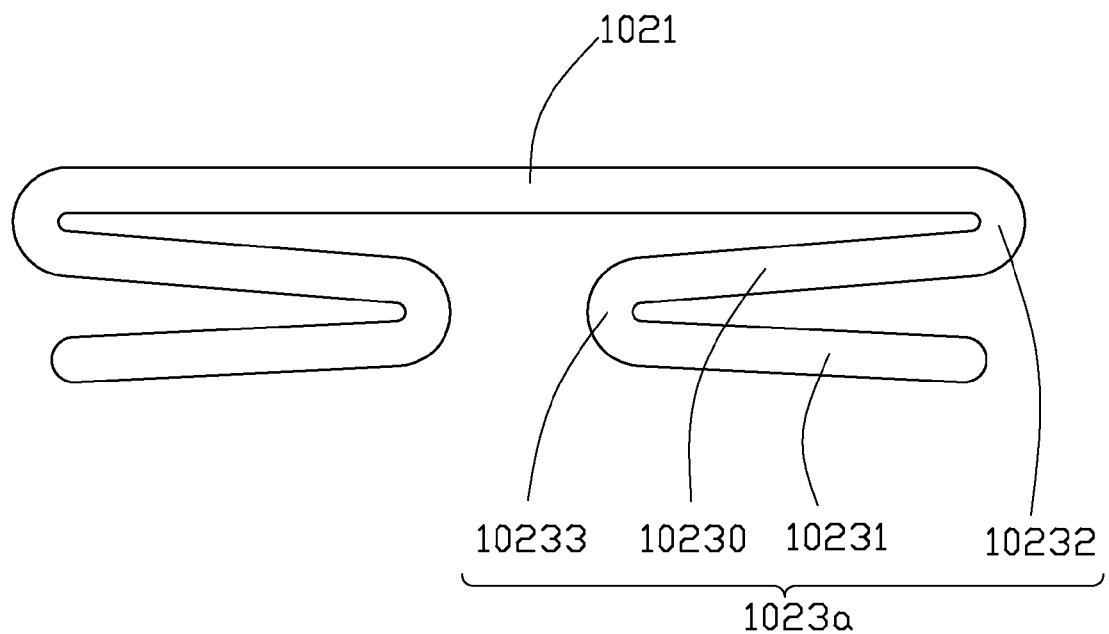
FIG. 6 is a front elevational view of the resilient clip of FIG. 5.

Referring to FIGS. 5 and 6, a second embodiment of the resilient clip 102 is shown. The difference between the second embodiment and the first embodiment is: in the second embodiment, there are no third bending portions 10234 formed at the free ends of the second slantwise extension portions 10231 of the resilient arms 1023a and a smooth, arc-shaped surface 10235 is formed at the free end of each of the second slantwise extension portions 10231. This prevents the operator from being hurt by the sharp free end of the second slantwise extension portion 10231.

In the present electronic apparatus, the resilient clip 102 includes two C-shaped bending portions and two slantwise extension portions, i.e., the first bending portion 10232 and the second bending portion 10233, and the first slantwise extension portion 10230 and the second slantwise extension portion 10231. Alternatively, the resilient clip 102 may include more than two bending portions and more than two slantwise extension portions. The bending portions of the resilient clip 102 increase fatigue strength of the resilient clip 102 as compared to a resilient clip without the bending portions, which accordingly increases the lifespan of the present resilient clip 102.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic apparatus comprising:
    a printed circuit board with a heat generating electronic component disposed thereon;
    a heat sink; and
    a mounting device for mounting the heat sink onto the heat generating electronic component, the mounting device comprising a mounting frame and at least two resilient clips attached to the mounting frame, the mounting frame comprising two first mounting arms and two second mounting arms disposed above the first mounting arms, the first mounting arms being attached to the printed circuit board, the at least two resilient clips being sandwiched between the second mounting arms of the mounting frame and the heat sink, the at least two resilient clips each comprising at least a resilient arm for providing a resilient force which urges the heat sink toward the heat generating electronic component.

2. The electronic apparatus of claim 1, wherein the mounting frame further comprises four connecting arms connected between the first mounting arms and the second mounting arms, the connecting arms extending upwardly from the first mounting arms and connecting free ends of the first mounting arms with free ends of the second mounting arms.

3. The electronic apparatus of claim 1, wherein a flange extends from each of the second mounting arms of the mounting frame toward an inner space of the mounting frame, the at least two resilient clips being attached to the flanges of the second mounting arms of the mounting frame.

4. The electronic apparatus of claim 1, wherein the at least two resilient clips each comprises a fastening plate, the at least a resilient arm being integrally disposed below the fastening plate, the fastening plate being attached to a corresponding one of the second mounting arms of the mounting frame, the at least a resilient arm extending downwardly from the fastening plate.

5. The electronic apparatus of claim 1, wherein the at least two resilient clips each comprises a fastening plate attached to a corresponding one of the second mounting arms of the mounting frame, the at least a resilient arm comprising a first bending portion, a first slantwise extension portion, a second bending portion, a second slantwise extension portion and a third bending portion, the first bending portion being disposed between the fastening plate and the first slantwise extension portion, the second bending portion being disposed between the first slantwise extension portion and the second slantwise extension portion, the third bending portion being formed at a free end of the second slantwise extension portion.

6. The electronic apparatus of claim 1, wherein the at least two resilient clips each comprises a fastening plate attached to a corresponding one of the second mounting arms of the mounting frame, the at least a resilient arm comprising a first bending portion, a first slantwise extension portion, a second bending portion and a second slantwise extension portion, the first bending portion connecting being disposed between the fastening plate and the first slantwise extension, the second bending portion connecting the first slantwise extension with the second slantwise extension portion, an arc surface being formed at a free end of the second slantwise extension portion.

7. The electronic apparatus of claim 1, wherein the heat sink comprises a base and a fin assembly disposed on the base, and the fin assembly defines at least two cutouts for receiving the at least two resilient clips therein.

8. A mounting device configured for mounting a heat sink to a printed circuit board on which a heat generating electronic component is disposed, the mounting device comprising:
  a mounting frame comprising two first mounting arms configured for being attached to the printed circuit board, and two second mounting arms disposed above the first mounting arms; and
  at least two resilient clips configured for being sandwiched between the second mounting arms of the mounting frame and the heat sink, the at least two resilient clips each comprising at least a resilient arm configured for providing a resilient force which urges the heat sink toward the heat generating electronic component.

9. The mounting device of claim 8, wherein the mounting frame further comprising four connecting arms connected between the first mounting arms and the second mounting arms, the four connecting arms extending upwardly from the first mounting arms and connecting free ends of the first mounting arms with free ends of the second mounting arms.

10. The mounting device of claim 8, wherein the at least two resilient clips each comprises a fastening plate, the at least a resilient arm being integrally disposed below the fastening plate, the fastening plate being attached to a corresponding one of the second mounting arms of the mounting frame, the at least a resilient arm extending downwardly from the fastening plate.

11. The mounting device of claim 10, wherein a flange extends from each of the second mounting arms of the mounting frame toward an inner space of the mounting frame, the at least two resilient clips each being attached to a corresponding one of the flanges of the second mounting arms of the mounting frame.

12. The mounting device of claim 8, wherein the at least two resilient clips each comprise a fastening plate, the at least a resilient arm being disposed below the fastening plate, the at least a resilient arm comprising a first bending portion, a first slantwise extension portion, a second bending portion and a second slantwise extension portion, the first bending portion being disposed between the fastening plate and the first slantwise extension portion, the second bending portion being disposed between the first slantwise extension portion and the second slantwise extension portion.

13. The mounting device of claim 12, wherein the at least a resilient arm further comprises a third bending portion formed at a free end of the second slantwise extension portion.

14. The mounting device of claim 13, wherein the first bending portion, the second bending portion and the third bending portion are C-shaped in profile.

15. The mounting device of claim 12, wherein the at least a resilient arm comprises an arc surface formed at a free end of the second slantwise extension portion.

* * * * *